(12) United States Patent
Lee et al.

(10) Patent No.: US 7,834,451 B2
(45) Date of Patent: Nov. 16, 2010

(54) FILM TRAY FOR FABRICATING FLEXIBLE DISPLAY

(75) Inventors: Kyu Sung Lee, Seoul (KR); Do Geun Kim, Changwon (KR); Kwan Seop Song, Suwon (KR); Hee Cheol Kang, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 549 days.

(21) Appl. No.: 11/512,649

(22) Filed: Aug. 29, 2006

(65) Prior Publication Data

US 2007/0049033 A1 Mar. 1, 2007

(30) Foreign Application Priority Data

Aug. 31, 2005 (KR) .................. 10-2005-0080995

(51) Int. Cl.
*H01L 23/34* (2006.01)
(52) U.S. Cl. ................ 257/727; 257/730; 257/E23.003
(58) Field of Classification Search .......... 257/727, 257/730, E23.003
See application file for complete search history.

(56) References Cited

U.S. PATENT DOCUMENTS

| | | | |
|---|---|---|---|
| 4,690,510 A | 9/1987 | Takamatsu et al. | |
| 5,801,542 A | 9/1998 | Kajiwara et al. | |
| 6,071,388 A | 6/2000 | Uzoh | |
| 6,299,745 B1 | 10/2001 | Kumar et al. | |
| 6,797,625 B2 | 9/2004 | Kim et al. | |
| 6,924,654 B2 | 8/2005 | Karavakis et al. | |
| 2003/0131874 A1* | 7/2003 | Davis et al. ............ | 134/33 |
| 2004/0183958 A1 | 9/2004 | Akiyama et al. | |

FOREIGN PATENT DOCUMENTS

| | | |
|---|---|---|
| CN | 2387609 Y | 7/2000 |
| JP | 06-097092 A | 4/1994 |
| JP | 07-201948 A | 8/1995 |
| JP | 2565919 | 10/1996 |
| JP | 09-021840 A | 1/1997 |
| JP | 2726317 | 12/1997 |
| JP | 2000-269310 | 9/2000 |

(Continued)

OTHER PUBLICATIONS

TIPO Search Report dated Oct. 14, 2008, for corresponding Taiwan Application No. 095131556, with English translation indicating the relevance of the cited references in this IDS.

(Continued)

*Primary Examiner*—Ngan Ngo
(74) *Attorney, Agent, or Firm*—Christie, Parker & Hale, LLP

(57) ABSTRACT

A film tray for fabricating a flexible display, the film tray preventing a flexible substrate or film from sagging. The film tray includes a support plate and at least one pair of clamps, each clamp of the at least one pair of clamps located along an opposite edge of the support plate to fix a flexible film. A first clamp of the at least one pair clamps is aligned with a second clamp of the least one pair of clamps. Each clamp includes an open-shut part adapted to be opened to receive the flexible substrate or film and adapted to be shut to fix the flexible substrate or film and a support part separated from the open-shut part by a predetermined space to support the flexible substrate or film at a predetermined level when the open-shut part is closed.

14 Claims, 11 Drawing Sheets

FOREIGN PATENT DOCUMENTS

| | | |
|---|---|---|
| JP | 2001-168176 A | 6/2001 |
| JP | 2004-034552 A | 2/2004 |
| TW | 491955 | 6/2002 |
| TW | 200305914 | 11/2003 |
| TW | M261711 | 4/2005 |
| TW | 200527967 | 8/2005 |
| WO | WO 2004/060690 A1 | 7/2004 |

OTHER PUBLICATIONS

Japanese Office Action dated Jan. 27, 2009 in corresponding Japanese Patent Application No. 2006-126660, listing the cited references in this IDS.

SIPO Patent Gazette issued Jan. 21, 2009 for corresponding Chinese Patent Application No. 200610112369.7, listing the cited references in this IDS.

Patent Abstract of Japan for Application No. 62-207732, filed Aug. 20, 1987 in the name of Kanehara, et al.

Patent Abstract of Japan for Application No. 01-279170, filed Oct. 26, 1989 in the name of Watananbe.

Patent Abstract of Japan for Patent No. 2000-269310, published Sep. 29, 2000 in the name of Yamada.

China Office action dated Sep. 21, 2007, for CN 2006101123697, with English translation.

* cited by examiner

FILM TRAY FOR FABRICATING FLEXIBLE DISPLAY

CROSS-REFERENCE TO RELATED APPLICATIONS

This application claims priority to and the benefit of Korean Patent Application No. 10-2005-80995, filed on Aug. 31, 2005, in the Korean Intellectual Property Office, the entire content of which is incorporated herein by reference

BACKGROUND

1. Field of the Invention

The present invention relates to a film tray, and more specifically, to a film tray for fabricating a flexible display.

2. Discussion of Related Art

Recently, technology of flexible displays such as an Organic Light Emitting Diode Display have been actively researched and developed. An Organic Light Emitting Diode (OLED) is used for an OLED Display. The OLED includes an anode electrode, an emitting light layer and a cathode electrode. The anode electrode supplies a hole for an emitting light layer and the cathode electrode supplies the electron for the emitting light layer. The holes supplied by the anode electrode and the electron supplied from cathode electrode generate light after being combined in the emitting light layer.

The formation process of a thin film as part of a flexible display has typically been carried out by a deposition method using a mask. However, sagging of the flexible substrate or film may occur in the thin film forming processes, preventing accurate sputtering and patterning. Also, since sputtering is performed within a vacuum chamber, it becomes difficult to transfer the flexible substrate or film to the chamber without any defects affecting the flexible substrate or film. Thus, there is a need for a film tray for fabricating a flexible display capable of preventing the flexible substrate or film from sagging at the time of manufacturing.

SUMMARY OF THE INVENTION

A film tray is provided for fabricating a flexible display. In one exemplary embodiment, the film tray includes a support plate and a support plate and at least one pair of clamps, each clamp of the at least one pair of clamps being located at a perimeter of the support plate to fix a flexible medium. A first clamp of the at least one pair clamps is aligned with a second clamp of the least one pair of clamps. Each clamp includes an open-shut part adapted to open to receive the flexible medium and adapted to close to fix the flexible medium, an open-shut part adapted to open to receive the flexible medium and adapted to close to fix the flexible medium, and a support part adjacent to the open-shut part for providing a predetermined space to support the flexible medium at a predetermined level when the open-shut part is closed. An opening is formed in the central part of the support plate. The width of the support plate ranges from about 10 mm to about 50 mm. The support plate and clamps may be formed from a light metal like the aluminum or the synthetic resins such as a Carbon Fiber Reinforced Plastic. The support plate and clamps may be formed by the different metal bonding.

According to another exemplary embodiment of the present invention, a film tray is provided for flexible substrates attached to inflexible substrates. The film tray includes a support frame and a substrate support section formed within the perimeter of the support frame, the substrate support section providing a recess to support the flexible substrate attached to an inflexible substrate. The substrate support section corresponds to the size of the flexible substrate attached to an inflexible substrate.

According to yet another exemplary embodiment of the present invention, a method of forming a thin film as part of a flexible medium is provided. The method includes providing a film tray including a support plate and at least one pair of clamps, each clamp of the at least one pair of clamps being located at a perimeter of the support plate to fix a flexible medium, a first clamp of the at least one pair of clamps being aligned with a second clamp of the least one pair of clamps. The flexible medium is inserted into an open open-shut part of each clamp of the at least one pair of clamps and the open-shut part of each clamp of the least one pair of clamps is closed to fix the flexible medium. Finally, the thin film is deposited onto the flexible medium.

According to still another exemplary embodiment of the present invention, a method of forming an emission layer of an organic light emitting diode is provided. The method includes providing a film tray including a support plate and at least one pair of clamps, each clamp of the at least one pair of clamps being located at a perimeter of the support plate to fix a flexible medium, a first clamp of the at least one pair of clamps being aligned with a second clamp of the least one pair of clamps. A donor film is inserted into an open open-shut part of each clamp of the at least one pair of clamps, the donor film including a base substrate, a light to thermal conversion layer and a thermal image layer. The open-shut part of each clamp of the least one pair of clamps is closed to fix the donor film. The donor film is placed in contact with an upper section of a combination of an acceptor substrate, an anode electrode, a hole pouring layer and a hole transferring layer and the donor film is laser patterned through the support plate. Finally, the donor film is removed from the acceptor substrate such that the emission layer is formed only in the portion of the acceptor substrate contacted by a laser.

DETAILED DESCRIPTION

Figure 1:
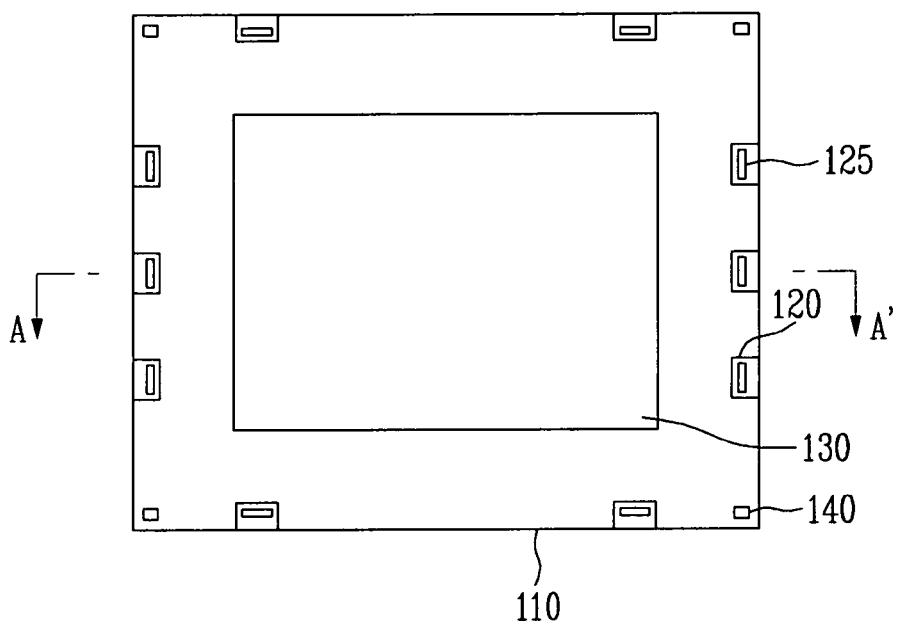
FIG. 1 is a top view of a film tray for fabricating a flexible display according to one embodiment of the present invention.

Referring to FIG. 1, the film tray 100 for fabricating a flexible display includes a support plate 110, clamps 120 established along edges of an upper side of the support plate 110 and an opening 130 formed in the central part of the support plate 110.

The support plate 110 is used to support the flexible film when the flexible film is fixed or transferred. The support plate 110 may be formed from light metals like Aluminum (Al) or synthetic resins such as Carbon Fiber Reinforced Plastic (CFRP). If the support plate 110 is made from aluminum, it is possible to combine the joint part (i.e., where the support plate and the clamps are joined to each other) of the support plate 110 and clamps 120 using steel. More specifically, the support plate 110 and the clamps 120 may have a partially heterogeneous structure between steel and aluminum. Alternatively, the support plate 110 and the clamps 120 may be made of aluminum and steel so their joint part may be achieved by a heterojunction. The support plate 110 is typically manufactured to have a width ranging between about 10 mm to about 50 mm.

The size and thickness of the support plate may be based on various sizes of the flexible film. For example, if the support plate 110 supports flexible film of 4-generation level (730× 920 mm$^2$), the support plate may be manufactured to a width of 1240 mm, a length of 900 mm and a thickness of 15 mm, (1240×900×15 mm$^3$). A hole 140 may be formed on an edge of the support plate into which a pin for fixing (not shown) may be inserted. The pin for fixing serves to prevent the film tray 100 from moving when a thin film is deposited onto flexible film fixed on the film tray 100.

The opening 130 is formed in order to reduce the weight of the support plate 110. Also, the opening 130 serves to limit the areas of the film onto which materials may be deposited.

The clamps 120 serve to fix the flexible film. At least two clamps are formed symmetrical with each other on an edge of the upper side of the support plate 110. In one embodiment of the present invention, the clamps 120 are formed to be symmetrical on all four edges of the upper side of the support plate 110 in order to stably fix the flexible film. Such clamps 120 may be manufactured from light metals like aluminum and synthetic resins such as CFRB. In addition, a square-shaped groove 125 may be formed in the clamps 120 to reduce the weight of the film tray. Although the groove 125 is described as square-shaped in this embodiment, the groove is not limited to this shape.

Figure 2:
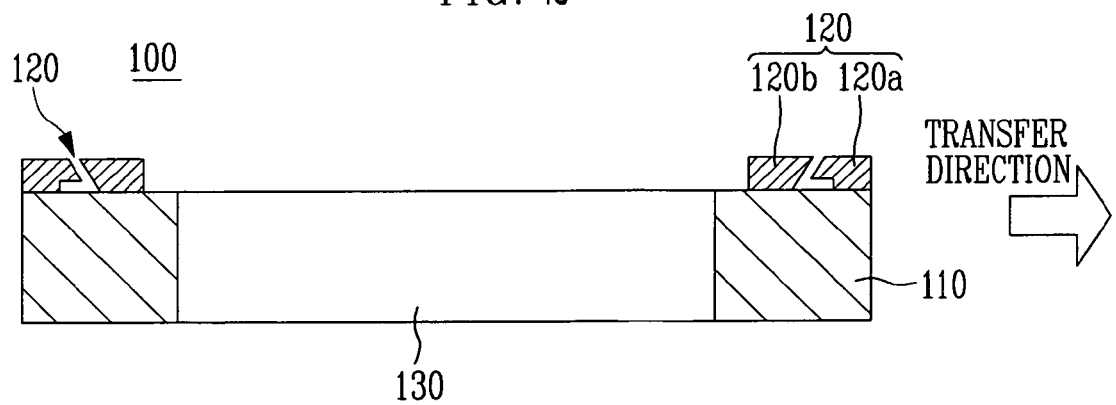
FIG. 2 is a side cross-sectional view of the film tray of FIG. 1 through section line A-A'.

Referring to FIG. 2, the clamp 120 is established in a defined distance from the open-shut end 120a to fix the flexible film and to keep the film flat. The clamp 120 is adapted to be capable of opening and shutting at the open-shut end 120a, such as by pivoting. A supporting part 120b is provided to fix and support the flexible film at a desired height. A step is formed on the interior of the open-shut end 120a to fix the flexible film. The exterior of the support part 120b is formed so as to be able to be combined with the step created on the interior of the open-shut end 120a.

The film tray 100 may be used in a process chamber and then be transferred by a transferring robot (not shown) in a direction indicated in FIG. 2.

The film tray 100 may also be used in a laser-induced thermal imaging process using a donor film. For example, a Light-to-Heat Conversion Layer (LTHC), a transfer layer and the like may be formed while the base substrate of a flexible donor film is fixed on the support plate 110 and transferred to the deposition chamber.

Figure 3A:
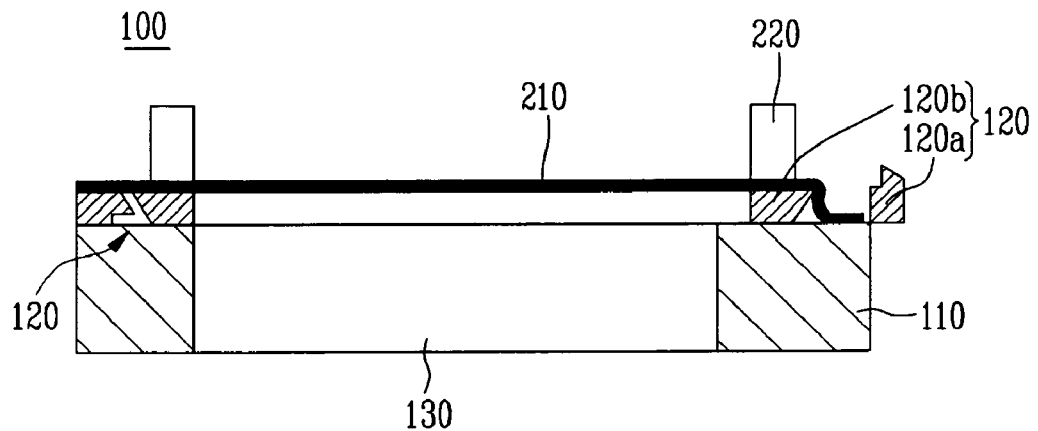
FIGS. 3A, 3B and 3C are cross-sectional views illustrating a method of fixing a flexible film to a film tray.
Figure 3B:
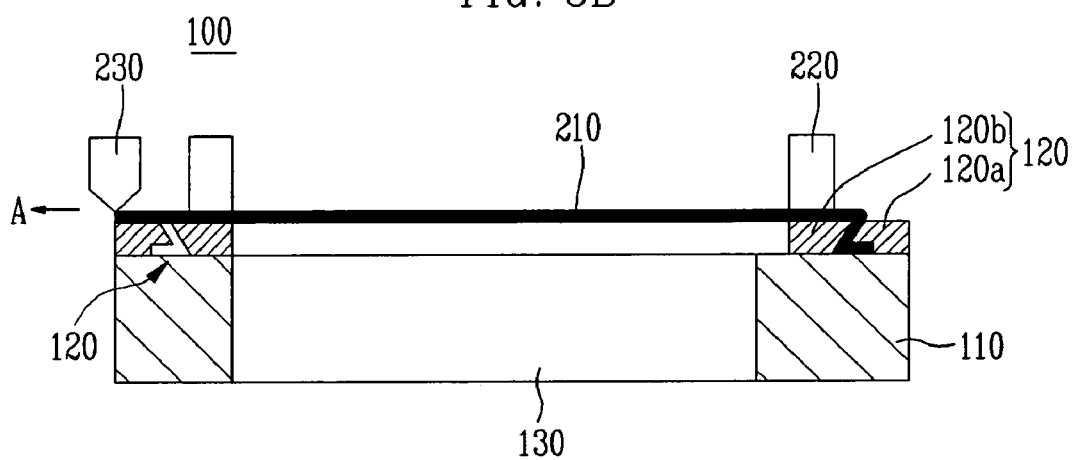
Figure 3C:
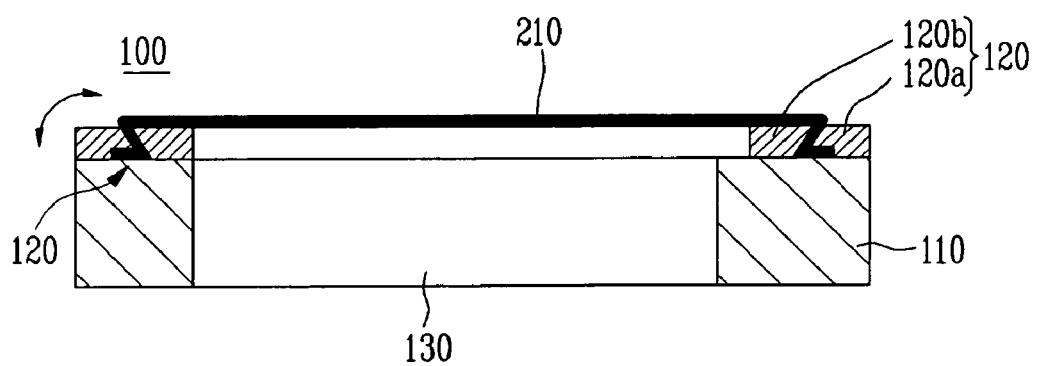

Referring to FIGS. 3A to 3C, the flexible film 210 is placed on the film tray 100 when the open-end part 120a is open. One side of the flexible film 210 is inserted into the open-shut part 120a. An external deviation prevention device 220, for example, a removable weighted block, fixes the flexible film 210 using pressure to prevent the flexible film 210 from folding or bending on the film tray 100. The flexible film 210 described here is film formed by soft materials such as polyethyleneterephthalate (PET), polyethersulfone (PES) and polycarbonate (PC). (See FIG. 3A)

One side of the flexible film 210 is fixed by closing the open-end 120a. After one side of the flexible film 210 has been fixed, the flexible film 210 is tensioned to prevent the flexible film 210 from sagging. Then the flexible film 210 may be sized with the cutter 230. For example, the flexible film 210 may be sized such that the flexible film does not sag more than 20 mm. (See FIG. 3B)

A second side of the flexible film 210 is then fixed by another clamp 120 by inserting the flexible film into the open open-shut part 120a and closing the open-shut part adjacent to support part 120B. (See FIG. 3C)

When the flexible film 210 is fixed using the above-described method, the shape of the flexible film is maintained even when a thin film is applied to the flexible film 210 or when the flexible film 210 is transferred. Therefore, it is possible to perform sputtering and patterning at the desired location and position, and it is possible to make the thin films uniform in the entire sputtering area. Also, the flexible film 210 may be conveniently transferred.

Figure 4:
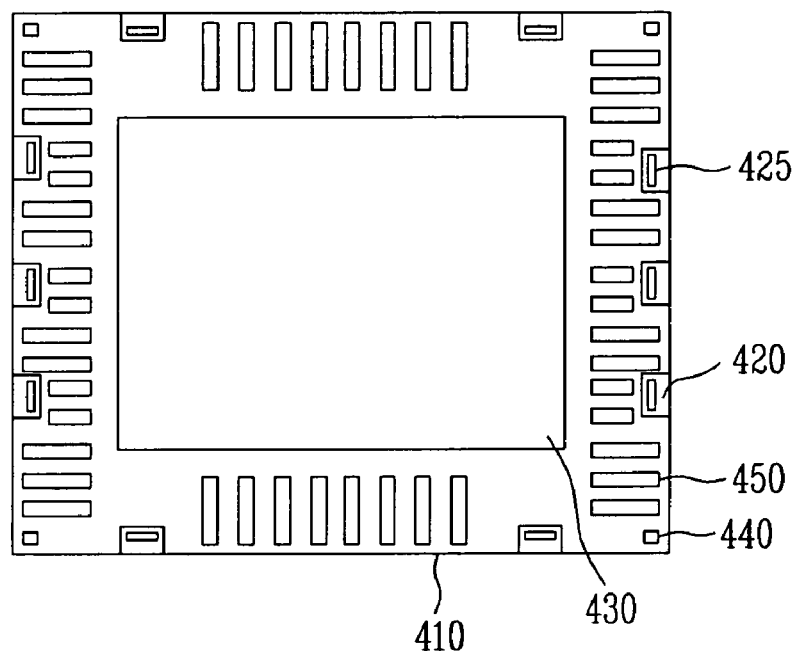
FIG. 4 is a top view of a film tray for fabricating a flexible display according to another embodiment of the present invention.

Referring to FIG. 4, the film tray for fabricating a flexible display 400 includes a support plate 410, clamps 420 on the edges of the upper side of the support plate 410 and an opening 430 formed in the central part of the support plate 410, according to another embodiment of the present invention.

A fixing hole 440 adapted to receive a fixing pin (not shown) is located on at least one corner portion of the support plate 410. The support plate 410 and the clamps 420 include a plurality of four-sided grooves 450, 425 to make the support plate lighter. As the support plate 410, clamps 420, opening 430, fixing hole 440 and grooves 450, 425 are previously described above, a more detailed explanation will not follow.

Figure 5:
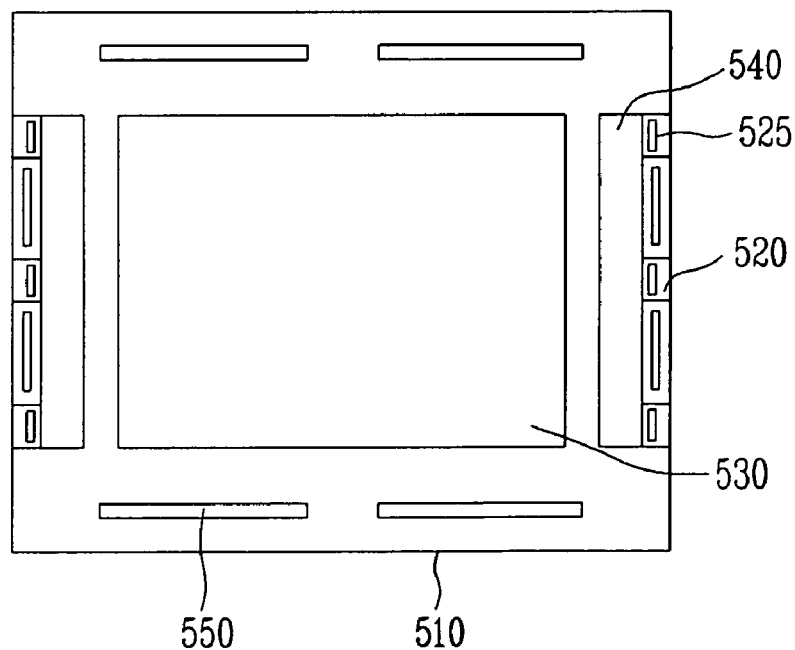
FIG. 5 is a top view of a film tray for fabricating a flexible, display according to yet another embodiment of the present invention.

Referring to FIG. 5, the film tray for fabricating a flexible display 500 includes a support plate 510, clamps 520 symmetrical with each other on two edges of an upper side of the support plate, an opening 530 formed in the central section of the support plate, and front side supporting sections 540 established to support the clamps 520.

Figure 6A:
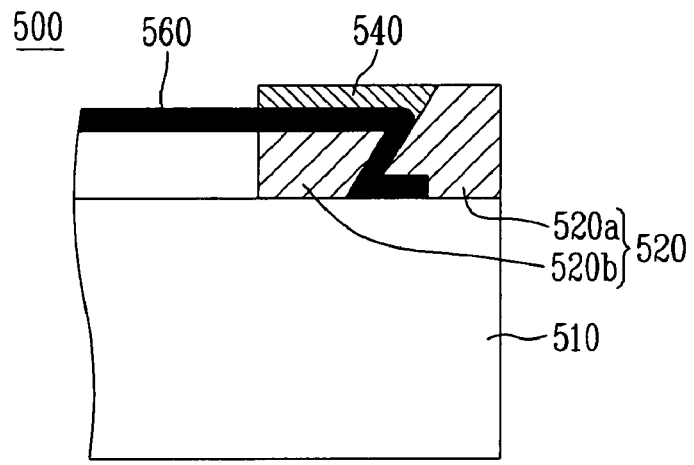
FIG. 6A is a partial cross-sectional view of the film tray of FIG. 5.
Figure 6B:
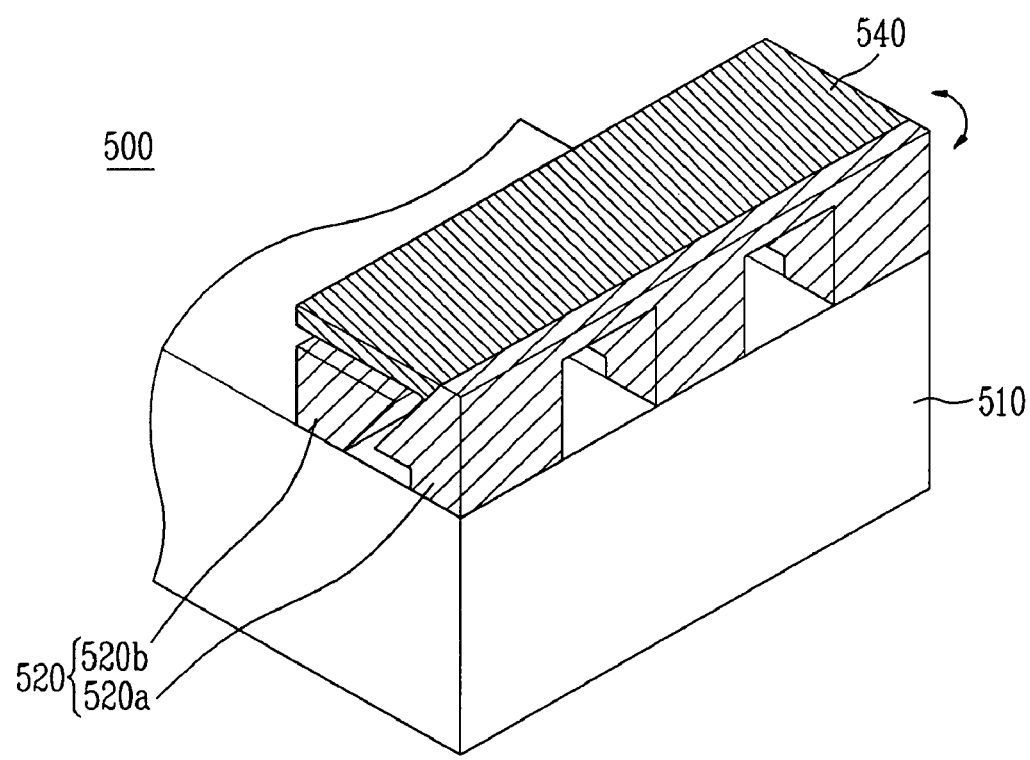
FIG. 6B is a partial perspective view of the film tray of FIG. 5.

The front side support sections 540 are established to be symmetrical with each other and to securely fix the flexible film. As shown in FIGS. 6A and 6B, the front side support sections 540 are established to jointly bond with the open-shut end 520a of the clamps 520 and to be located above the support part 520b. Such front side section 540 is open and shut together with the open-shut part 520a to keep the flexible film 560 flat by keeping the flexible film 560 in tension.

Figure 7A:
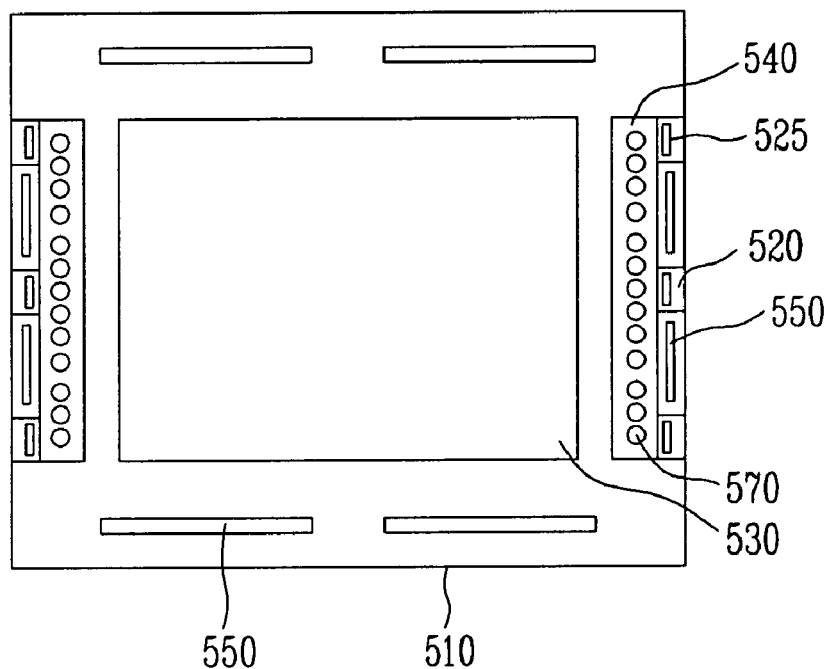
FIGS. 7A and 7B show another embodiment of a film tray for fabricating a flexible display according to the present invention.
Figure 7B:
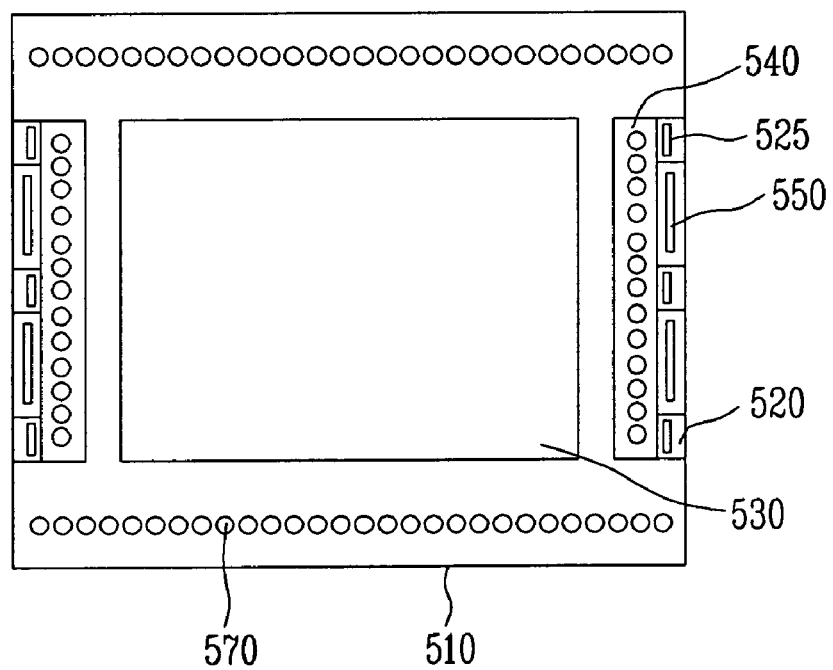

The film tray 500 may further include a plurality of holes 570 in the front side support section 540 to further reduce the weight as shown in FIG. 7A. The film tray 500 may also include a plurality of holes 570 in the support plate 510 and front side support section 540 as shown in FIG. 7B. For example, 58 holes 570 with a diameter of about 30 mm may be formed in the film tray 500. Generally, holes 570 are formed to have a diameter of between about 10 mm to about 50 mm, but they are not limited in size, number, or location.

Figure 8A:
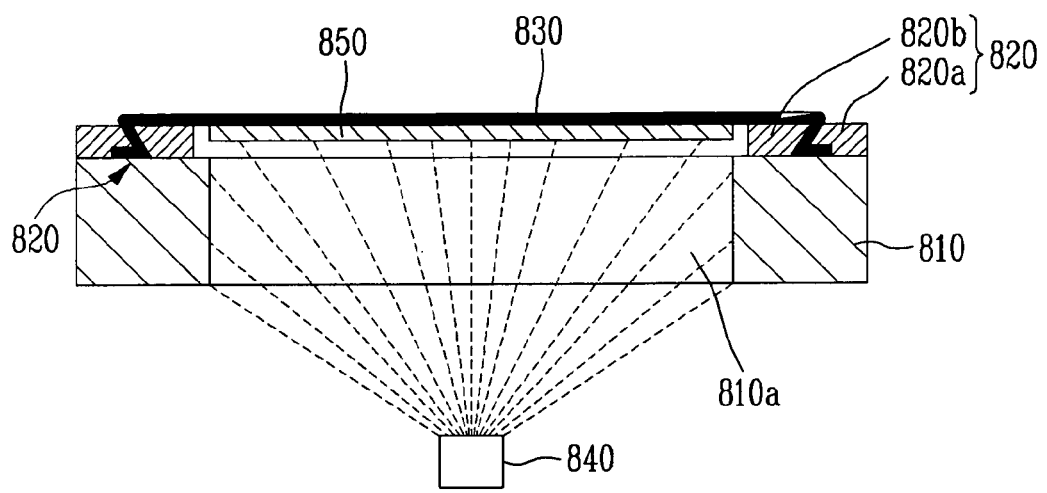
FIG. 8A is the cross-sectional view that shows a thin film deposited onto a flexible film using the film tray of FIG. 2.

Referring now to FIG. 8A, the flexible film 830 (or flexible substrate) is fixed by clamps 820 on the support plate 810 having opening 810a. A deposition substance is supplied to the flexible film 830 from a deposition source 840 located in the lower section of the support plate 810. The deposition substance is deposited on the flexible film 830 (or flexible substrate) through the opening 810a of the support plate 810. Thereby, a thin film 850 is formed which corresponds to the size of the opening 810a on the flexible film 830 (or flexible substrate). The opening 810a serve to limit the deposition area of the thin film 850. The deposition of the thin film 850 may be performed by using various methods such as, for example, sputtering, thermal deposition or chemical vapor deposition.

Figure 8B:
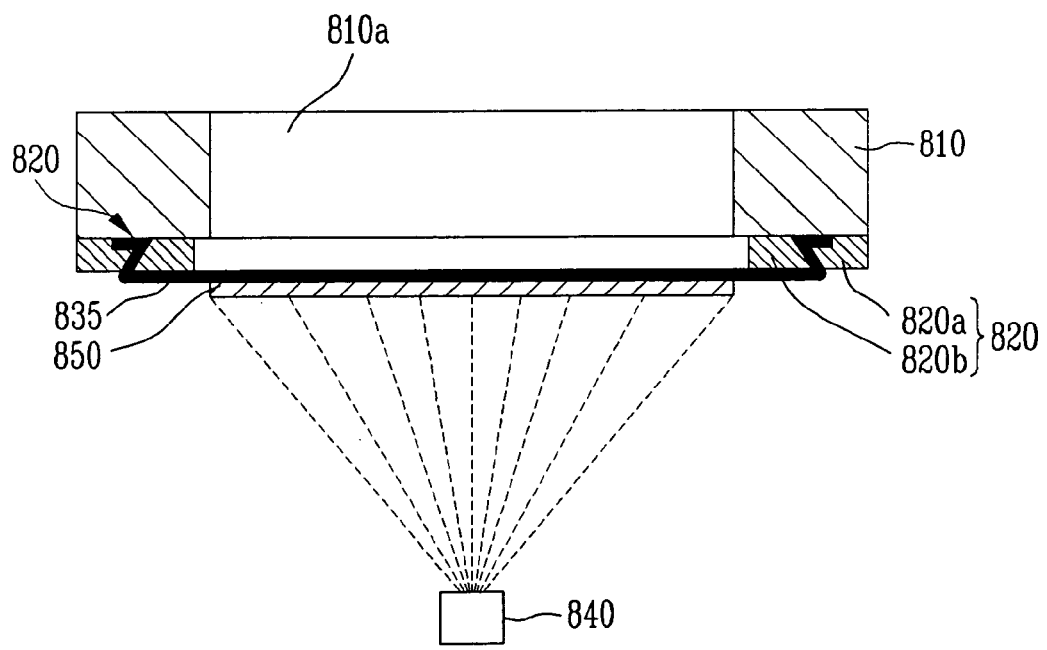
FIG. 8B is a cross-sectional view showing fabrication of donor film using the film tray of FIG. 2.

A donor film may be manufactured by using a film tray for fabricating flexible display as described herein. Donor film may be used when the thin film is formed by a laser-induced thermal imaging method. For example, donor film may be used when the organic emission layer of an OLED is formed. In this case, the base substrate 835 of the flexible donor films as shown in FIG. 8B is transferred to a chamber (for example, to the deposition chamber) after the base substrate is fixed by clamps 820 and located in the lower section of the support plate 810. The thin film 850 is formed in the base substrate 835 when supplied from the deposition source 840 located in the lower section of the base substrate 835. A light to thermal conversion layer and thermal image layer may be formed as the thin film 850. When the film tray is transferred to a chamber, a transferring robot(not shown) is used.

Referring to FIGS. 9A to 9D, to form an emission layer, donor film 950 is located on an accepter substrate 910 wherein an anode electrode 920, a hole injection layer 930 and a hole transfer layer 940 are formed. The donor film 950 here includes a base substrate 950a, a light to thermal conversion layer 950b and a thermal image layer 950c. The base substrate 950a works as a support substrate to support the donor film 950 and is made from a high molecular substance, for example, PET and so on. Such base substrate 950a is fixed to prevent the donor film 950 from sagging.

A light to thermal conversion layer 950b includes a radiation absorber for converting the absorbed laser to thermal energy. Namely, the light to thermal conversion layer 950b absorbs the laser radiation and then converts it to thermal energy. Such a light to thermal conversion layer 950b may include infrared rays such as carbon black, black lead, infrared dyes, pigment within oxide and sulfide, and so on.

A thermal image layer 950c is manufactured as a coating of organic thin film and includes a light emitting layer. A small amount of a substance, for example, a dopant, may be added to improve various characteristics of the light emitting layer.

Figure 9A:
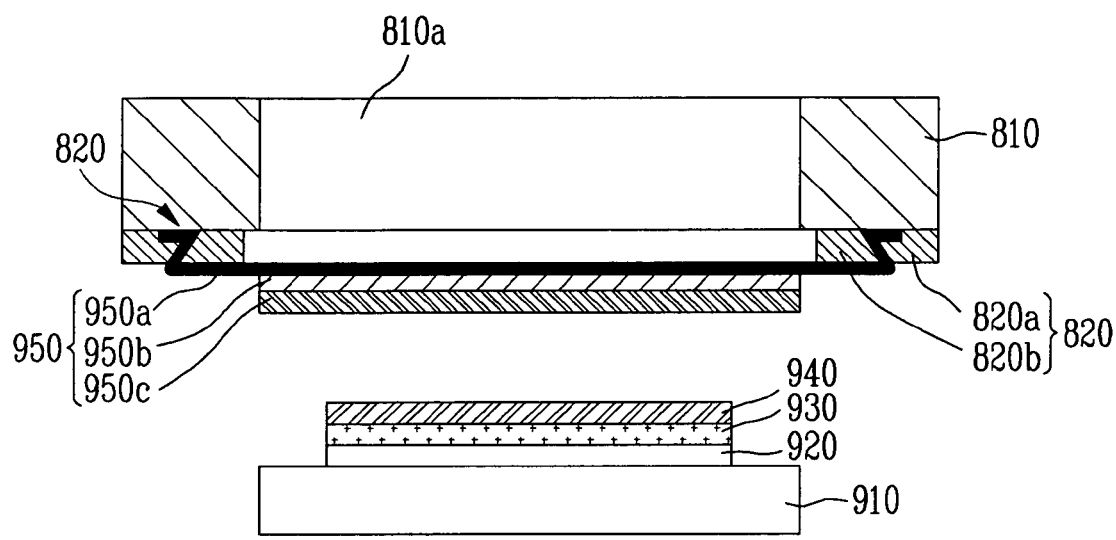
FIGS. 9A, 9B, 9C and 9D are cross-sectional views showing the formation of an emission layer of an organic light emitting diode using the film tray of FIG. 8B.
Figure 9B:
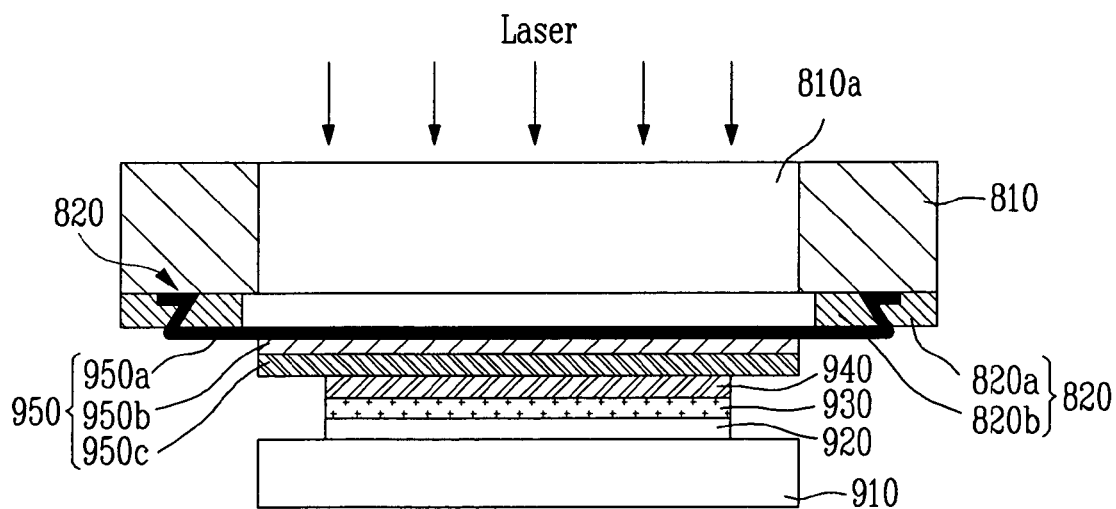

The donor film 950 may be placed in contact with an upper section of the combination of accepter substrate 910, anode electrode 920, hole pouring layer 930 and hole transferring layer 940. Patterning may be performed after optionally irradiating the laser in the area where the emission layer is to be formed. The laser can reach the donor film 950 through openings 810a formed in the support plate 810 of the film tray for fabricating flexible display. (FIG. 9B)

Figure 9C:
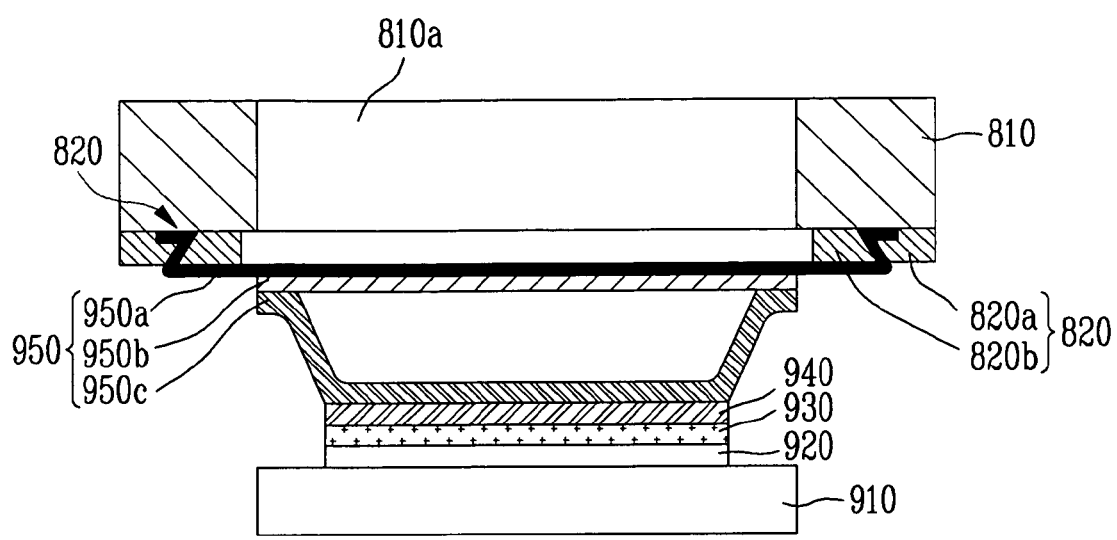

When the donor film 950 is removed from the accepter substrate 910, the portion of the thermal image layers 950c which the laser contacted will adhere to the hole transfer layer 940 and then will be separated from the donor film 950. (FIG. 9C).

Figure 9D:
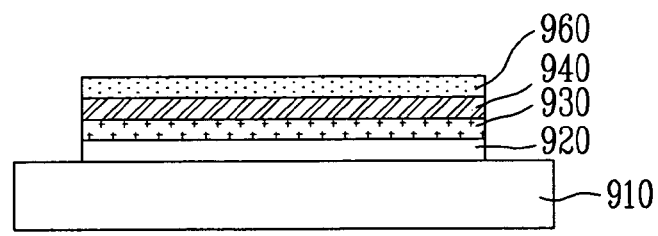

Thus, when the donor film 950 is removed from the accepter substrate 910, the light emitting layer 960 is formed only in the portion of the acceptor substrate 910 which was contacted by the laser. (FIG. 9D)

When a donor film 950 is manufactured by using the film tray for fabricating a flexible display shown in FIG. 8B, the light to thermal conversion layer 950b and thermal image layer 950c may be formed on the base substrate 950a because the base substrate 950a remains flat even though it is flexible. Accordingly, it is possible to form a uniform light to thermal conversion layer 950b and thermal image layer 950c in the desired location on the base substrate 950a.

Also, when the emission layer is formed on a donor film 950 that is held flat by the film tray for fabricating flexible display as shown in FIG. 8B, the possibility of misalignment is reduced.

FIGS. 10A to 10E show a film tray for fabricating a flexible display and its fixing method according to yet another embodiment of the present invention. The film tray 1100 of this embodiment may be used for a flexible substrate or a flexible film and includes a square-shaped support frame 1100a, substrate support section 1100b to secure the flexible film, and opening 1110 through which sputtering may be performed.

Such film tray 1100 is used to fix a flexible film 1200 adhered to an inflexible substrate 1300, such as a glass substrate. The film tray 1100 may be manufactured from the same materials and in substantially the same manner as the film trays described above.

Figure 10A:
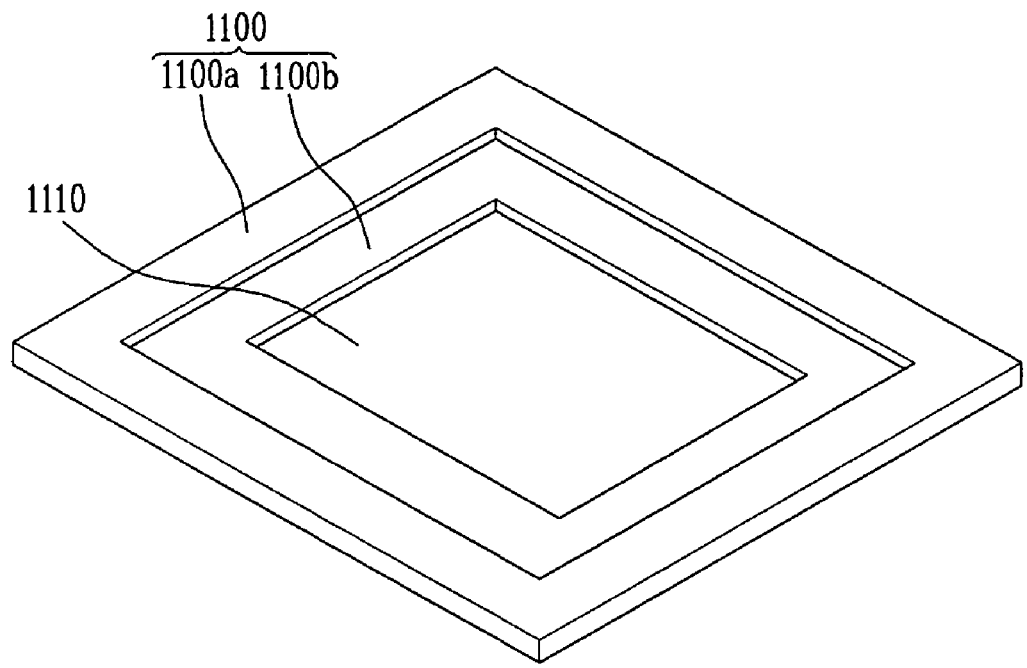
FIGS. 10A, 10B, 10C, 10D, and 10E illustrate a film tray for fabricating a flexible display according to yet another embodiment of the present invention.
Figure 10B:
Figure 10C:
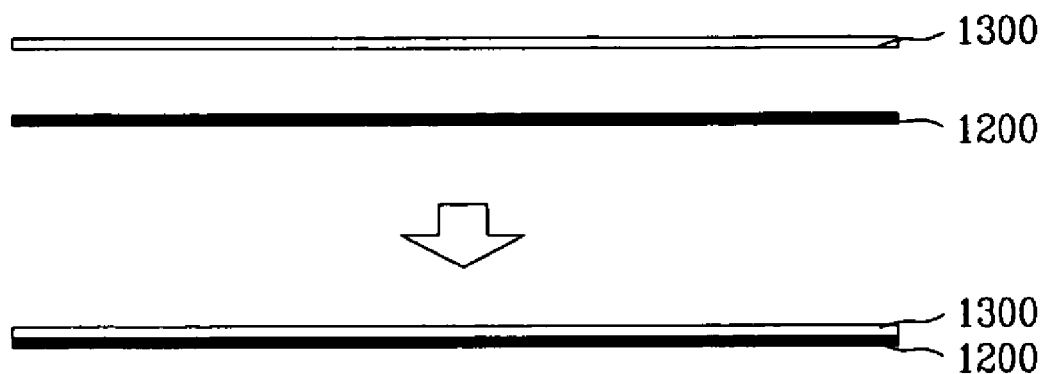

The flexible film 1200 may be adhered to an inflexible substrate 1300 in order to prevent the flexible film 1200 from sagging during transferring and deposition. (FIG. 10C)

Figure 10D:
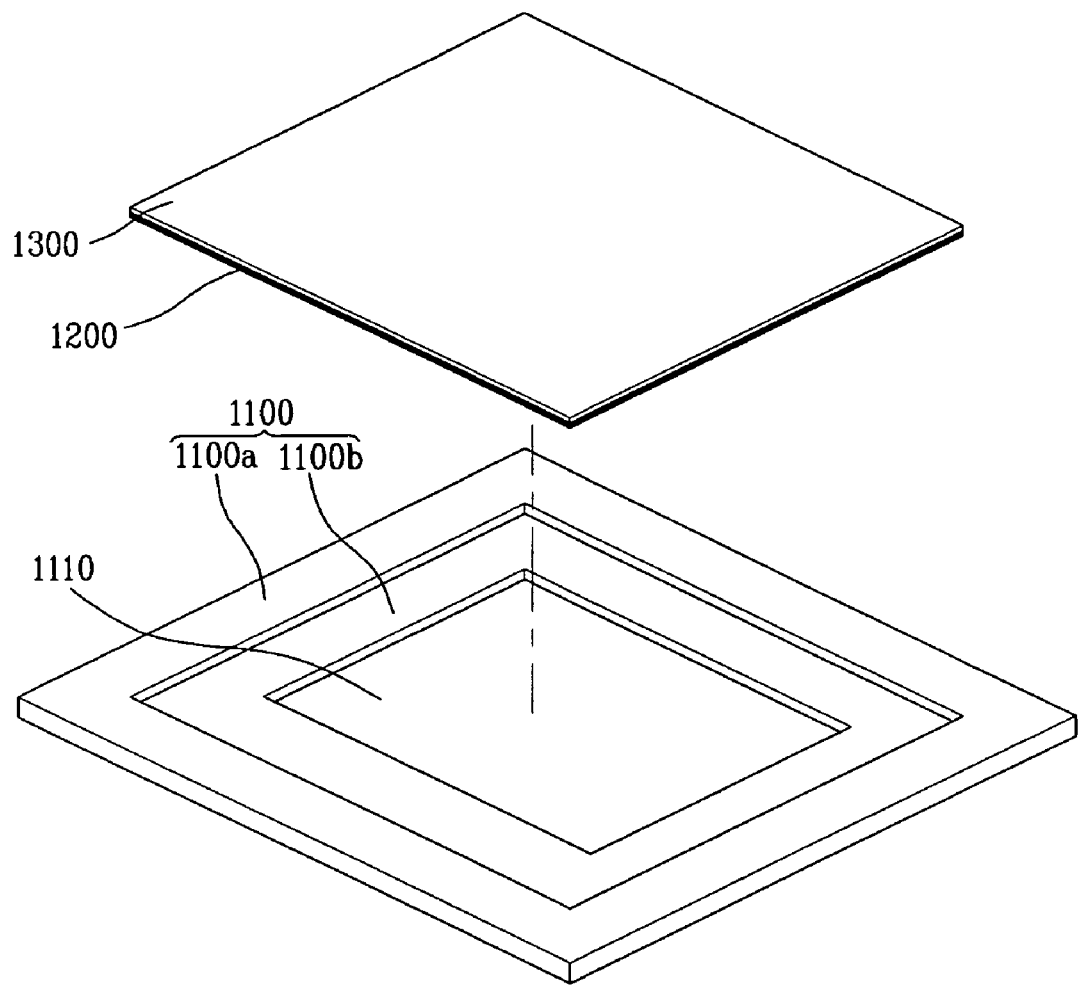
Figure 10E:
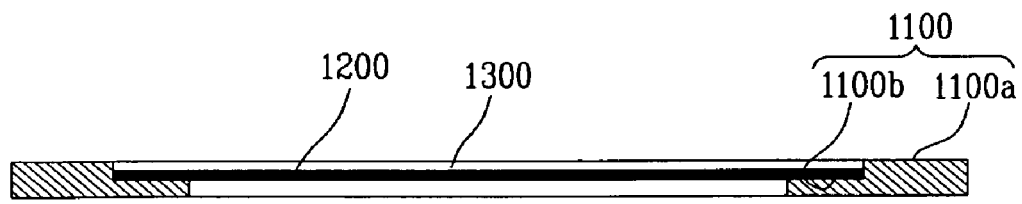

Then, the flexible film 1200 and the inflexible substrate 1300 are secured and settled within the film tray 1100. The flexible film 1200 may be secured and settled within the substrate support section 1100b of the film tray. (FIGS. 10D to 10E).

Since the flexible film 1200 does not sag or bend when it is mounted on the film tray 1100, it is possible to perform uniform sputtering and patterning of the thin film in the desired location on the flexible film 1200.

According to the embodiments of the present invention as described above, a flexible substrate or flexible substrate, or film is able to be kept flat when a thin film is deposited onto the flexible substrate. Accordingly, it is possible to perform uniform sputtering and patterning in a desired location. Also, the flexible substrate or film can be conveniently transferred without deformation. Also, when a film tray for fabricating a flexible display of the present invention is used in a laser thermal image method using a donor film, the possibility of misalignment is reduced because the donor film can be kept flat.

What is claimed is:

1. A film tray for supporting a flexible medium during fabrication of a flexible display comprising:
   a support plate; and
   at least one pair of clamps, each clamp of the at least one pair of clamps being located at a perimeter of the support plate to fix a flexible medium, a first clamp of one of the at least one pair of clamps being aligned with a second clamp of the one of the at least one pair of clamps,
   wherein each clamp of the at least one pair of clamps comprises:
       an open-shut part adapted to pivotally open with respect to the support plate to receive the flexible medium and adapted to close to fix the flexible medium between the open-shut part and the support plate; and
       a support part adjacent to and spaced from the open-shut part to provide a space to receive and support the flexible medium when the open-shut part is closed, wherein the open-shut part comprises an interior end forming a step and the support part comprises an exterior end forming a wall, the wall and the step generally corresponding to each other and adapted to clamp the flexible medium therebetween.

2. The film tray as claimed in claim 1, each clamp of the at least one pair of clamps further comprising a front support extending from the open-shut part parallel to a front side of the support part, the front support being adapted to apply pressure on the flexible medium to further keep the flexible medium in tension when the open-shut part is closed.

3. The film tray as claimed in claim 2, wherein at least one hole or groove is formed in at least one of the support plate, the at least one pair of clamps or the front support to minimize the weight of the support plate.

4. The film tray as claimed in claim 1, wherein the support plate has an opening through a central part of the support plate.

5. The film tray as claimed in claim 1, wherein the support plate has a thickness of between about 10 mm to about 50 mm.

6. The film tray as claimed in claim 1, wherein at least one of the support plate or the at least one pair of clamps comprises at least one of a metal or a synthetic resin.

7. The film tray as claimed in claim 6, wherein at least one of the support plate and the at least one pair of clamps is formed by joint bonding different metals.

8. The film tray as claimed in claim 6, wherein the metal is aluminum.

9. The film tray as claimed in claim 6, wherein the synthetic resin is carbon fiber reinforced plastic.

10. The film tray as claimed in claim 7, wherein the different metals are aluminum and steel.

11. The film tray of claim 1, wherein the flexible medium is a flexible film or a flexible substrate.

12. The film tray of claim 1, wherein the open-shut part is configured to contact the flexible medium in a closed position.

13. The film tray of claim 1, wherein the open-shut part and the support part are configured to each contact the flexible medium when the open-shut part is closed.

14. A film tray for supporting a flexible medium during fabrication of a flexible display comprising:
 a support plate; and
 at least one pair of clamps, each clamp of the at least one pair of clamps being located at a perimeter of the support plate to fix a flexible medium, a first clamp of one of the at least one pair of clamps being aligned with a second clamp of the one of the at least one pair of clamps,
 wherein each clamp of the at least one pair of clamps comprises:
 an open-shut part adapted to pivotally open with respect to the support plate to receive the flexible medium and adapted to close to fix the flexible medium between the open-shut part and the support plate, wherein each clamp fixes the flexible medium in a folded configuration.

* * * * *